US 6,649,859 B2

(12) United States Patent
Miura et al.

(10) Patent No.: US 6,649,859 B2
(45) Date of Patent: Nov. 18, 2003

(54) ELECTRON BEAM IRRADIATION SYSTEM AND ELECTRON BEAM IRRADIATION METHOD

(75) Inventors: Yoshihisa Miura, Kanagawa (JP); Yuichi Aki, Tokyo (JP)

(73) Assignee: Sony Corporation (JP)

( * ) Notice: Subject to any disclaimer, the term of this patent is extended or adjusted under 35 U.S.C. 154(b) by 57 days.

(21) Appl. No.: 10/083,382

(22) Filed: Feb. 27, 2002

(65) Prior Publication Data
US 2002/0121504 A1 Sep. 5, 2002

(30) Foreign Application Priority Data
Feb. 28, 2001 (JP) .................................... P2001-054739

(51) Int. Cl.[7] .............................................. B23K 15/00
(52) U.S. Cl. ......................... 219/121.22; 219/121.21; 219/121.23
(58) Field of Search ................. 219/121.22, 121.21, 219/121.23, 212.12, 121.35

(56) References Cited

U.S. PATENT DOCUMENTS

| | | | |
|---|---|---|---|
| 4,068,112 A | 1/1978 | Marhic | 250/310 |
| 6,300,630 B1 | 10/2001 | Veneklasen | 250/310 |
| 6,320,195 B1 * | 11/2001 | Magome | 250/442.11 |
| 6,496,248 B2 * | 12/2002 | Tanaka | 355/72 |
| 6,559,456 B1 * | 5/2003 | Muraki | 250/491.1 |

FOREIGN PATENT DOCUMENTS

| | | |
|---|---|---|
| EP | 1 152 417 | 3/2001 |
| JP | 3-78953 | 4/1991 |
| JP | 8-36979 | 2/1996 |

* cited by examiner

Primary Examiner—M. Alexandra Elve
(74) Attorney, Agent, or Firm—Rader, Fishman & Grauer PLLC; Ronald P. Kananen (57) ABSTRACT

In a partial-vacuum-type, electron-beam irradiation system having a construction such that a static-pressure floating pad is connected to a vacuum chamber incorporating an electron-beam column, and an electron-beam passes through an electron-beam passage of the static-pressure floating pad to impinge on a body to be irradiated in the condition where the static-pressure floating pad is contactlessly attracted to the body to be irradiated, a vacuum-seal valve for opening and closing the electron-beam passage is provided inside the static-pressure floating pad, and when the static-pressure floating pad is separated away from the body to be irradiated, the vacuum-seal valve is actuated to close the electron-beam passage, whereby the atmospheric air is prevented from flowing into the vacuum chamber.

8 Claims, 5 Drawing Sheets

ABSTRACT

ELECTRON BEAM IRRADIATION SYSTEM AND ELECTRON BEAM IRRADIATION METHOD

BACKGROUND OF THE INVENTION

The present invention relates to an electron-beam irradiation system and an electron-beam irradiation method which are used, for example, for recording on a master of optical disks.

In recent years, as to optical disks, there has been a demand for a higher recording density and, for this purpose, it is necessary to form recording pits more finely.

In the manufacture of a master for optical disks, therefore, a system for recording by irradiating the master with an electron-beam in place of a conventional laser light has been proposed.

In such an electron-beam irradiation system, irradiation with the electron-beam in a vacuum environment is required to obviate the problem that the electron-beam is scattered due to its collision with gas molecules.

In this case, if the entire body of the electron-beam irradiation system is placed in a vacuum environment, a large vacuum space and a large-type exhaust means are required, so that the system becomes large in size and high in cost.

To obviate this problem, the present applicant has proposed, in Japanese Patent Application No. 2000-57374, a oartial-vacuum-type, electron-beam irradiation system in which only the portion for irradiation with the electron-beam is placed in a vacuum state.

Namely, in this electron-beam irradiation system, a static-pressure floating pad is connected to an electron-beam outlet of a vacuum chamber in which an electron-beam column is incorporated, the static-pressure floating pad is contactlessly attracted to a master with a small gap of about several micrometers under suction by an exhaust means and supply of a compressed gas by a gas-supply means, and, in this condition, an electron-beam emitted from an electron gun passes through an electron-beam passage at a central portion of the static-pressure floating pad to impinge upon the master.

In the electron-beam irradiation system, as above, the operation of exchanging the master makes it necessary to retract the static-pressure floating pad from the master.

In this case, the static-pressure floating pad is separated completely from the master, so that the atmospheric air flows into the inside of the vacuum chamber through the electron-beam passage of the static-pressure floating pad, and the electron-beam column is exposed to the atmospheric air.

Therefore, it is necessary to protect the electron gun by closing a gate valve of the electron-beam column while the high vacuum before the retraction of the static-pressure floating pad is maintained and the exhaust means (vacuum pump) for providing vacuum in the vacuum chamber by turning OFF the power source thereof; thus, workability is very poor.

Besides, in the case of starting up the vacuum system again after the exchange of the master, several hours is taken for the degree of vacuum in the vacuum chamber to be raised to a level suitable for irradiation with the electron-beam and to be stabilized. Thus, the system is very poor in efficiency in that the waiting time is longer than the time required for recording on the master by irradiation with the electron-beam.

Further, since the inside of the vacuum chamber is opened to the atmospheric air each time the master is exchanged, there is the problem of contamination of the insides of the vacuum chamber and the electron-beam column due to taking in dust from the atmospheric air.

SUMMARY OF THE INVENTION

The present invention has been made in consideration of the above-mentioned problems, and, accordingly, it is an object of the present invention to solve the above-mentioned problems by making it possible to maintain a desired degree of vacuum in the vacuum chamber even where the static-pressure floating pad is separated from the body to be irradiated (original disk) in the oartial-vacuum-type electron-beam irradiation system.

In order to attain the above object, according to the aspect of the present invention, there is provided an electron-beam irradiation system including an electron-beam column, a vacuum chamber incorporating the electron-beam column and a static-pressure floating pad connected to the vacuum chamber wherein an electron-beam passes through an electron-beam passage to impinge on a body to be irradiated in the condition where the static-pressure floating pad is contactlessly attracted to the body to be irradiated. The electron-beam irradiation system also includes a vacuum-seal valve for opening and closing the electron-beam passage, the vacuum-seal valve being provided in the inside of the static-pressure floating pad.

According to another aspect of the present invention, there is provided an electron-beam irradiation method using an electron-beam irradiation system including an electron-beam column, a vacuum chamber incorporating the electron-beam column, and a static-pressure floating pad connected to the vacuum chamber, wherein an electron-beam passes through an electron-beam passage to impinge on a body to be irradiated in the condition where the static-pressure floating pad is contactlessly attracted to the body to be irradiated. The electron-beam irradiation method includes the step of moving a vacuum-seal valve that is movably disposed in the inside of the static-pressure floating pad to close the electron-beam passage, and thereby the inside of the vacuum chamber is maintained at a desired degree of vacuum.

In the electron-beam irradiation system and method according to the present invention constituted as above, the electron-beam passage is closed by operating the vacuum-seal valve when the static-pressure floating pad is separated from the body to be irradiated, whereby the atmospheric air is prevented from flowing into the vacuum chamber through the electron-beam passage, and the inside of the electron-beam column can be maintained at a degree of vacuum substantially suitable for irradiation with the electron-beam.

Therefore, according to the invention, it is unneccessary to protect the electron gun by closing the gate valve of the electron-beam column and turning OFF the power source of the exhaust means for the vacuum chamber each time when the static-pressure floating pad is separated from the body to be irradiated, as in the related art. Thus, the operation is simplified and operation time is shortened, namely, workability is enhanced. In addition, since the inside of the vacuum chamber can be maintained in a vacuum condition, contamination of the insides of the vacuum chamber and the electron-beam column can be prevented.

The above and other objects, features and advantages of the present invention will become apparent from the following description and appended claims taken in conjunction with the accompanying drawings which show by way of example some preferred embodiments of the invention.

DETAILED DESCRIPTION OF THE PREFERRED EMBODIMENT

Now, an embodiment of the present invention will be described below by referring to the drawings.

Here, an electron-beam irradiation system used for recording on a master of optical disks is shown as an example, and the basic constitution of the electron-beam irradiation system will first be described referring to FIGS. 1 and 2.

Figure 1:
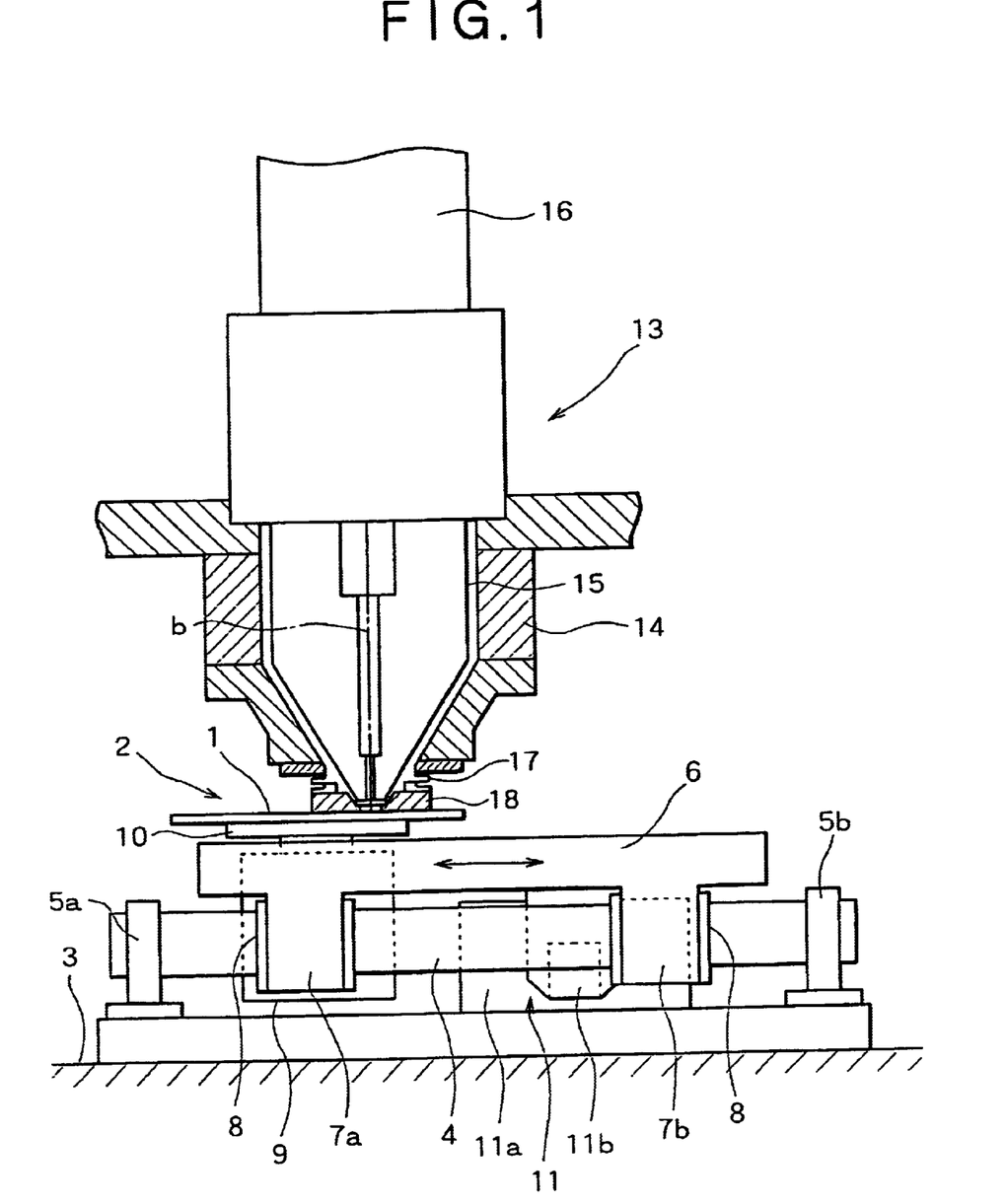
FIG. 1 is a front view of a basic structure of a oartial-vacuum-type electron-beam irradiation system to which the present invention is applied.

This system, as shown in FIG. 1, is for recording signals (formation of record pits in signal pattern) on a master 1, which is a body to be irradiated, by irradiation with an electron-beam b emitted from an electron gun 16.

Here, irradiation with the electron-beam requires a vacuum environment, and, particularly, this system adopts a oartial-vacuum system in which only the portion for irradiation with the electron-beam is maintained in a vacuum condition while the other portions are placed in the atmospheric air.

First, a support mechanism portion 2 for supporting the master 1 in the system will be described.

A guide rail 4 is horizontally disposed on a base 3 of the system, both left and right end portions of the guide rail 4 are fixed by fixing portions 5a, 5b, and a slide table 6 is movably supported on the guide rail 4 through bearings 8 provided at left and right leg portions 7a, 7b.

As the bearings 8, static-pressure air bearings are used, whereby a highly accurate moving mechanism with extremely little frictional resistance at the time of movement of the slide table 6 can be realized.

A motor 9, which is a rotating means for the master 1, is fixed on the slide table 6, and the master 1 is mounted on and supported by a turntable 10 fitted to a rotary shaft of the motor 9.

The motor 9 for rotating the master 1 is an electromagnetic-driving-type spindle motor, which is driven based on a control signal supplied from a control circuit, whereby the master 1 is rotated as one body with the turn-table 10.

Here, the motor 9 adopts a static-pressure air type bearing as a bearing for the rotary shaft thereof, and a highly accurate rotating mechanism with little load due to frictional resistance at the time of rotation and with good response properties can be realized.

In this system, a vacuum suction system is adopted as a chucking system for stationarily holding the master 1 on the turntable 10.

Further, a motor 11, which is a moving means for the slide table 6, is disposed between the slide table 6 and the base 3.

The motor 11 for moving the slide table 6 is an electromagnetic-driving-type linear motor. Namely, a magnetic circuit of a voice-coil type, for example, is provided between a stator 11a on the side of the base 3 and a mobile 11b on the side of the slide table 6, and the motor 11 is driven based on a control signal from the control circuit, whereby the slide table 6 is moved horizontally along the guide rail 4, and the master 1 is moved in a radial direction thereof as one body with the slide table 6.

On the upper side of a support mechanism portion 2 for the master 1, constituted as above, there is fixed an electron-beam irradiation means 13 for irradiation with an electron-beam while the upper side of the master 1 is partially maintained in a vacuum state.

Numeral 14 denotes a vacuum chamber hungly supported on the upper side of the master 1. An electron-beam column 15 is disposed in the inside of the vacuum chamber 14, and the electron-beam b is emitted from the electron gun 16, which is an electron-beam excitation source on the upstream side of the electron-beam column 15.

An exhaust means including a vacuum pump is connected to the vacuum chamber 14 incorporating the electron-beam column 15 therein. Suction is applied to the inside of the vacuum chamber 14 by the exhaust means, whereby the inside of the electron-beam column 15 is maintained at a vacuum degree (about $1 \times 10^{-4}$ Pa) substantially suitable for irradiation with the electron-beam.

A static-pressure floating pad 18 is fitted to an electron-beam outlet at a lower end portion of the vacuum chamber 14 through an expansion-contraction connection mechanism 17. The static-pressure floating pad 18 is contactlessly attracted to the master 1 with a minute gap of about 5 $\mu$m therebetween, and, in this condition, the electron-beam b emitted from the electron gun 16 passes through an electron-beam passage at a central portion of the static-pressure floating pad 18 to impinge upon the master 1.

Figure 2:
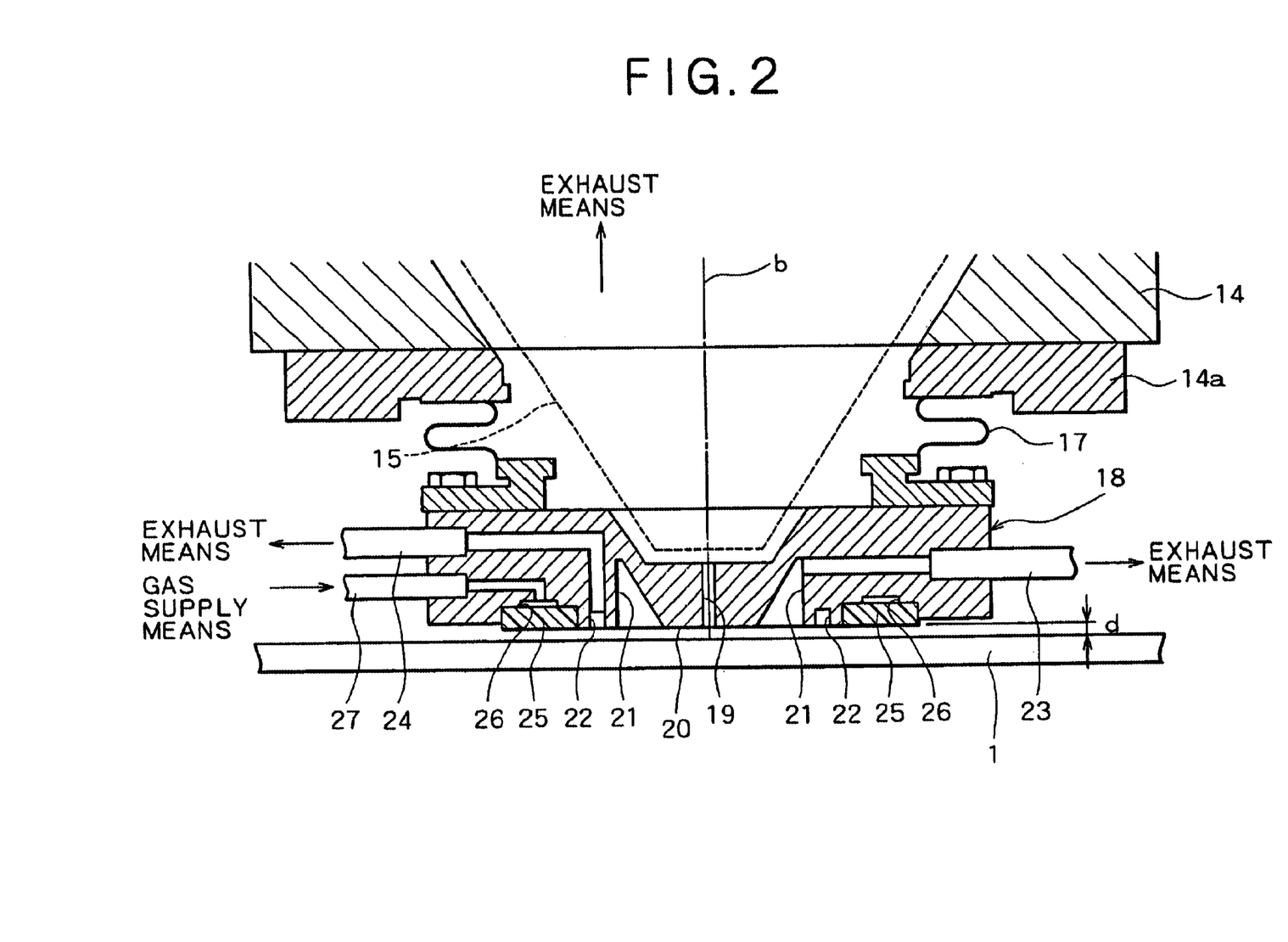
FIG. 2 is a vertical sectional view showing the structure of a static-pressure floating pad provided in the electron-beam irradiation system.

FIG. 2 shows a detailed structure of the static-pressure floating pad 18.

The static-pressure floating pad 18 includes, for example, a metallic block 20 provided with an electron-beam passage 19 for passage of the electron-beam b therethrough at a central portion thereof. The block 20 is airtightly connected to a fixed portion 14a at the lower end of the vacuum chamber 14 by the bellows-like expansion-contraction connection mechanism 17, and, by the expansion and contraction of the expansion-contraction connection mechanism 17, the block 20 can securely follow up the master 1 even when the master 1 shows non-uniformity of thickness, swing of rotation or the like.

As a means for attracting the block 20 onto the master 1, the block 20 is provided with a first suction groove 21 and a second suction groove 22 opened to the surface facing to the master 1, concentrically with the electron-beam passage 19 as a center.

The exhaust means is connected to the first suction groove 21 and the second suction groove 22 via an exhaust pipe 23 and an exhaust pipe 24, respectively. Exhausting, or suction of gas, is performed through the first suction groove 21 and the second suction groove 22 via the exhaust means.

As the exhaust means, vacuum pumps are used. In this case, vacuum pumps capable of exhausting the suction groove nearer to the electron-beam passage 19 to a higher degree of vacuum are connected. Namely, for the first suction groove 21 nearer to the electron-beam passage 19, a vacuum pump capable of providing a vacuum degree of, for example, about $1\times10^{-1}$ Pa is connected; for the second suction groove 22 on the outer side, a vacuum pump capable of providing a vacuum degree of about $5\times10^3$ Pa is connected.

Further, in the block 20, a gas-permeable body 25 exposed to a surface opposed to the master 1 is embedded on the outside of the second suction groove 22. The gas-permeable body 25 is formed of a porous metal or ceramic, such as carbon, having gas permeability in the shape of a ring with the electron-beam passage 19 as a center, and a gas passage 26 is provided in the inside of the block 20 on the back side of the gas-permeable body 25.

A gas-supply means is connected to the passage 26 through a gas-supply pipe 27, and a compressed gas (positive pressure) of, for example, about $5\times10^5$ Pa is supplied from the gas-supply means into the passage 26 and is jetted out from the gas-permeable body 25.

When the exhaust means and the gas-supply means are operated in the condition where the static-pressure floating pad 18 constituted as above is mounted on the master 1, the static-pressure floating pad 18 is made to minutely float up from the master 1 by the gas ejected from the gas-permeable body 25, and, simultaneously, a negative pressure is established in the first and second suction grooves 21 and 22 because the gas is sucked out of the grooves, whereby the static-pressure floating pad 18 is attracted toward the master 1. Therefore, the static-pressure floating pad 18 is contactlessly attracted to the master 1 while maintaining a gap d of about 5 μm therebetween, so that the rotation of the master 1 is not hampered.

At this time, the gas jetted from the gas-permeable body 25 is sucked into the first and second suction grooves 21 and 22 surrounding the gas-permeable body 25, so that the gas is prevented from reaching the electron-beam passage 19. In this case, the gas from the gas-permeable body 25 is first sucked into the second suction groove 22 and then sucked into the first suction groove 21. Since the suction force is greater in the first suction groove 21 than in the second suction groove 22, a higher degree of vacuum can be attained as the central portion of the static-pressure floating pad 18 is approached, whereby the inside of the vacuum chamber 14, namely, the inside of the electron-beam column 15, can be maintained at a vacuum degree (about $1\times10^{-4}$ Pa) substantially suitable for irradiation with the electron-beam.

The master 1 is irradiated with the electron-beam b in the condition where a part of the space on the master 1 is maintained in a vacuum by the static-pressure floating pad 18, and, simultaneously, the master 1 is rotated by the driving of the motor 9 of the support mechanism portion 2, and the master 1 is moved in a radial direction by the driving of the motor 11, whereby recording on a predetermined track is performed.

In the electron-beam irradiation system constituted as above, a oartial-vacuum system in which only the portion for irradiation with the electron-beam is maintained in a vacuum is adopted, so that it is unnecessary to maintain a large space in a vacuum. Therefore, use of a large-type exhaust means (vacuum pump) can be obviated, and the system can be constituted to be small in size and low in cost.

In the oartial-vacuum-type, electron-beam irradiation system, at the time of exchanging the master 1, the exhaust (suction) through the first and second suction grooves 21 and 22 of the static-pressure floating pad 18 is stopped, and the static-pressure floating pad 18 is retracted in a radial direction or to the upper side from the position over the master 1.

At this time, in order to prevent the atmospheric air from flowing into the inside of the vacuum chamber 14 through the electron-beam passage 19 of the static-pressure floating pad 18 due to the separation of the static-pressure floating pad 18 away from the master 1, particularly in the electron-beam irradiation system according to the present invention, a vacuum-seal valve mechanism is provided in the inside of the static-pressure floating pad 18.

Figure 3:
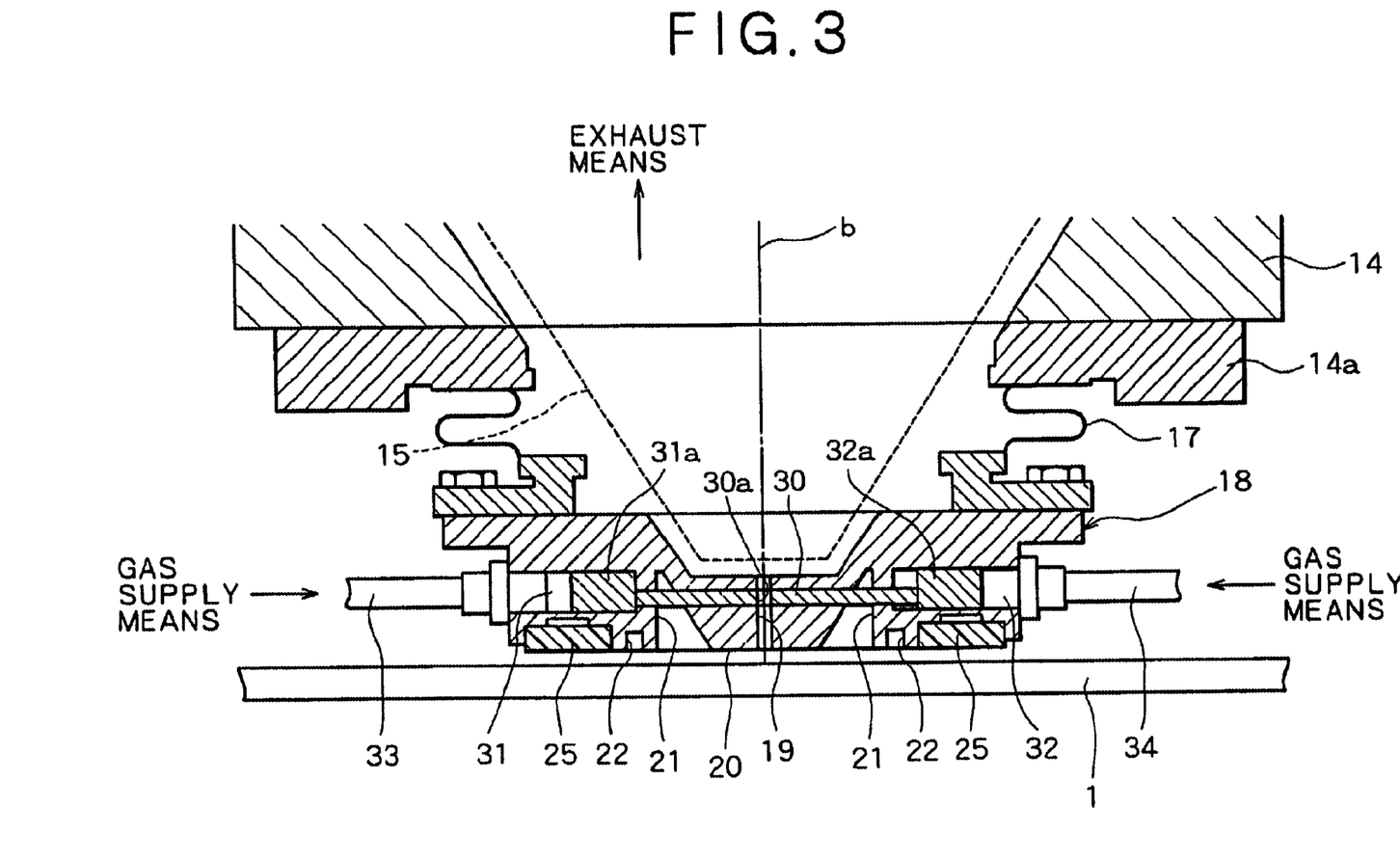
FIG. 3 is a vertical sectional view of the static-pressure floating pad to which the present invention is applied.

Details of the vacuum-seal valve mechanism are shown in FIG. 3.

In the present embodiment, in the inside of the block 20 constituting the static-pressure floating pad 18, a straight-rod-formed, vacuum-seal valve 30 is disposed orthogonally to the electron-beam passage 19 and movably in the left-right direction.

The vacuum-seal valve 30 is provided with a hole 30a having a diameter equivalent to or a little greater than that of the electron-beam passage 19, and the position of the hole 30a is moved by movement of the vacuum-seal valve 30, whereby switching operations of the valve, namely, opening and closing operations of the electron-beam passage 19 are performed.

Air-cylinder portions 31, 32 are provided on the left and right sides of the vacuum-seal valve 30 as actuating means for the vacuum-seal valve 30, and pistons 31a, 32a disposed in the air-cylinder portions 31, 32 are connected to left and right end portions of the vacuum-seal valve 30.

Gas-supply means including air pumps are connected to the left and right air-cylinder portions 31, 32 through gas-supply pipes 33, 34, and switching operations of the valve are performed by supplying a compressed gas selectively to the left and right air-cylinder portions 31, 32 from the gas-supply means.

Namely, when a compressed gas is supplied from the gas-supply means into the air-cylinder portion 31 on the left side in FIG. 3, the piston 31a is pushed in by the pressure of the compressed gas, and the vacuum-seal valve 30 is moved rightwards. In this condition, as shown in the figure, the hole 30a of the vacuum-seal valve 30 conforms to the electron-beam passage 19, so that the electron-beam passage 19 is opened. In this condition, irradiation with an electron-beam b is performed.

On the other hand, when a compressed gas is supplied from the gas-supply means into the air-cylinder portion 32 on the right side, the piston 32a is pushed in by the pressure of the compressed gas, and the vacuum-seal valve 30 is moved leftwards. In this condition, the hole 30a of the vacuum-seal valve 30 is staggered from the electron-beam passage 19, so that the electron-beam passage 19 is closed.

In the valve-switching operations, the pushing force for the pistons 31a, 32a is the product of the cross-sectional area of the piston and the pressure of the compressed gas. As the value of the product is higher, the pushing force is greater, and the stability at the time of the valve-switching operations is increased. The same effect also can be obtained by a surface treatment such as a Teflon coating, on the pistons 31a, 32a for reducing the frictional resistance at the time of sliding the pistons 31a, 32a.

As for the relationship between the vacuum-seal valve 30 and the static-pressure floating pad 18, the upper side of the vacuum-seal valve 30 is exhausted by the exhaust means connected to the vacuum chamber 14, whereas the lower side is exhausted by the exhaust means connected to the first and second suction grooves 21 and 22, so that the upper and lower sides are balanced with respect to force by the presence of negative pressures.

Therefore, in the switching operations of the valve, an unbalance of forces in the upward and downward directions which might cause trouble is not generated, and smooth switching operations are achieved.

When the valve-switching operation as above is finished, the supply of the compressed gas to the air-cylinder portions 31, 32 is stopped.

In the static-pressure floating pad 18 provided with the vacuum-seal valve mechanism, as described above, at the time of exchanging the master 1, a compressed gas is first supplied from the gas-supply means to the air-cylinder portion 32 on the right side to move the vacuum-seal valve 30 leftwards, thereby closing the electron-beam passage 19. Thereafter, exhaust from the first and second suction grooves 21 and 22 is stopped, and the static-pressure floating pad 18 is retracted from the position over the master 1.

At this time, even though the static-pressure floating pad 18 is completely separated from the master 1, the electron-beam passage 19 is closed by the vacuum-seal valve 30, so that the atmospheric air is prevented from flowing into the vacuum chamber 14 through the electron-beam passage 19, and an assured vacuum-seal condition is obtained, whereby the inside of the electron-beam column 15 can be maintained at a vacuum degree (about $1 \times 10^{-4}$ Pa) substantially suitable for irradiation with the electron-beam.

Figure 4A:
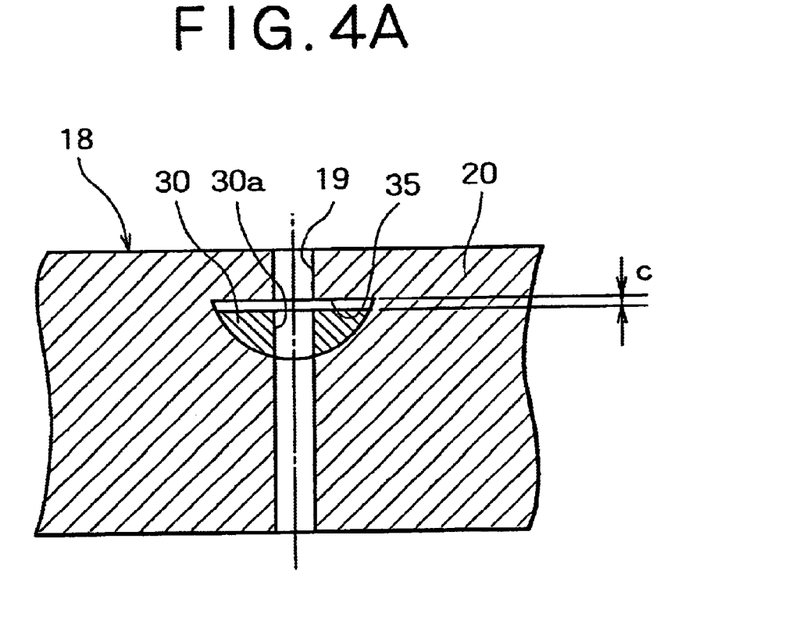
FIGS. 4A and 4B are vertical sectional views of portions incorporating a vacuum-seal valve in the static-pressure floating pad of FIG. 3.
Figure 4B:
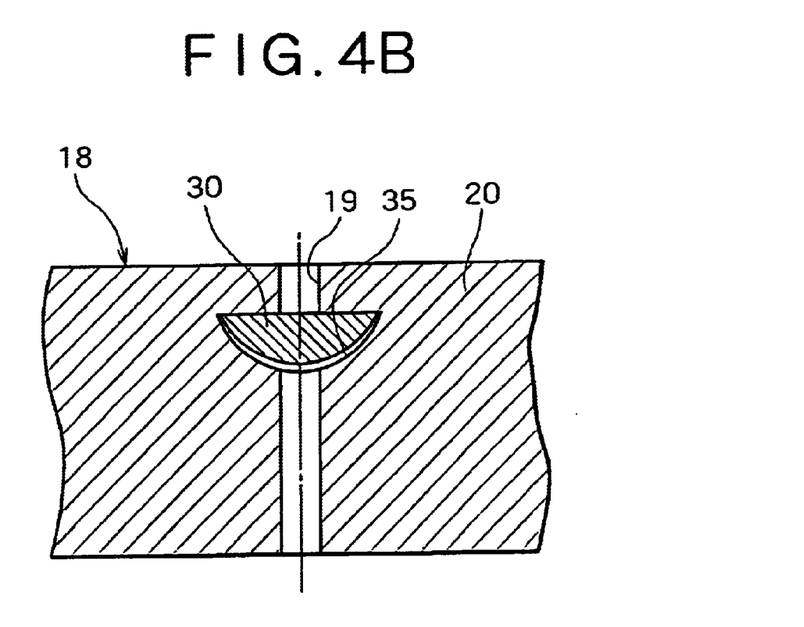

Further, in this vacuum-seal valve mechanism, in order to obtain stability of the valve-switching operations, it is effective to adopt a construction in which the vacuum-seal valve 30 is moved in the inside of the static-pressure floating pad 18 with a minute gap therebetween, as shown in FIGS. 4A and 4B.

Namely, in this case, in the block 20 of the static-pressure floating pad 18, a gap c of about 50 $\mu$m is provided between the vacuum-seal valve 30 and a valve passage 35 through which the vacuum-seal valve 30 is passed. Due to the presence of the gap c, the vacuum-seal valve 30 can be smoothly moved with little sliding resistance at the time of a switching operation, whereby a stable switching operation is achieved.

FIG. 4A shows the condition where the hole 30a of the vacuum-seal valve 30 conforms to the electron-beam passage 19 so that the electron-beam passage 19 is opened, whereas FIG. 4B shows the condition where the electron-beam passage 19 is closed by the vacuum-seal valve 30 so that the inside of the vacuum chamber is vacuum-sealed. In the vacuum-seal condition, the static-pressure floating pad 18 is separated from the master 1, whereby the above-mentioned balance of forces on the upper and lower sides of the vacuum-seal valve 30 is broken. Namely, the upper side of the vacuum-seal valve 30 is in a vacuum (negative pressure), whereas the lower side of the vacuum-seal valve 30 is at atmospheric pressure. Therefore, the vacuum-seal valve 30 is pushed up so as to be sucked onto the block 20, thereby closing the electron-beam passage 19, and whereby a vacuum-seal condition is securely maintained.

Figure 5:
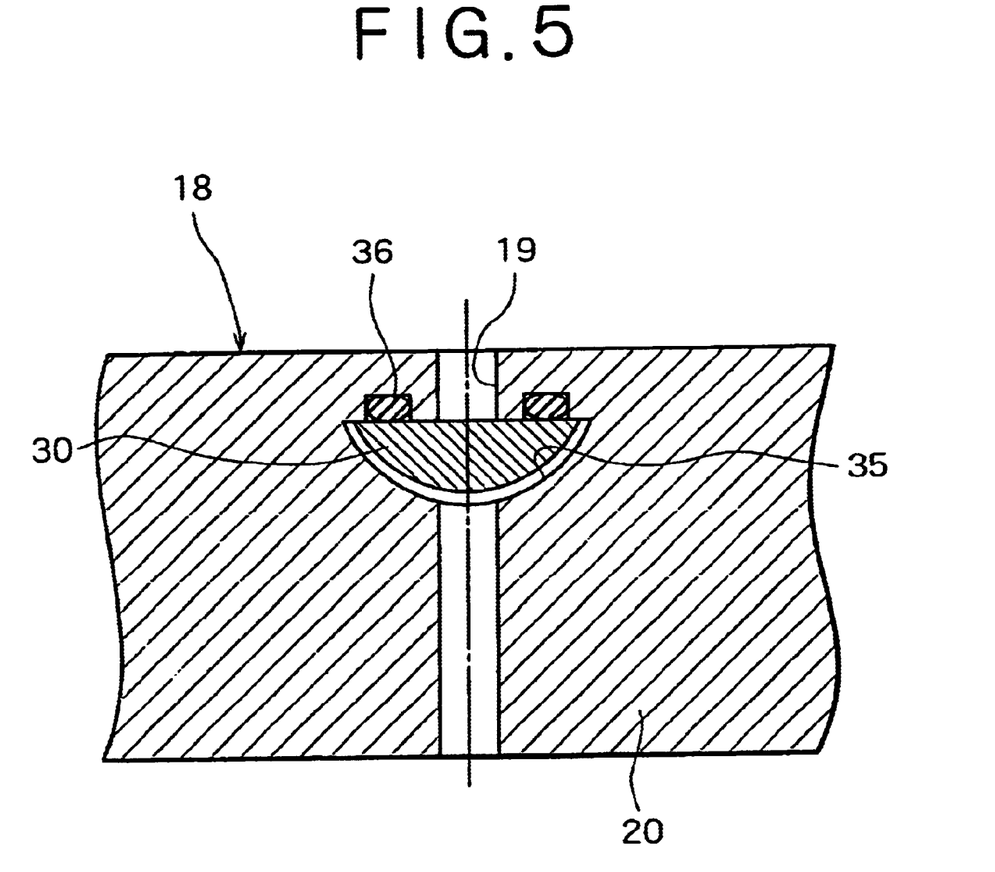
FIG. 5 is a vertical sectional view showing another constitution of the portion incorporating a vacuum-seal valve in the static-pressure floating pad of FIG. 3.

Further, in this constitution, to ensure that a more assured vacuum-seal condition can be obtained, a rubber-made O-ring 36 may be provided surrounding the electron-beam passage 19 inside the block 20 of the static-pressure floating pad 18, as shown in FIG. 5.

In this case, the O-ring 36 is fixed so as to front on the valve passage 35 with an appropriate collapsing allowance. In the condition where the electron-beam passage 19 is closed with the vacuum-seal-valve 30, the vacuum-seal valve 30 is pressed against the O-ring 36 so as to collapse the O-ring 36, whereby the electron-beam passage 19 is hermetically sealed, and a degree of vacuum can be securely maintained inside the vacuum chamber 14.

Irradiation with the electron-beam may be carried out even in this vacuum-seal condition. Therefore, to ensure that no trouble is generated from the collision of the electron-beam on the vacuum-seal valve 30, it is preferable to form the vacuum-seal valve 30 from a ceramic having excellent heat resistance.

After the exchange of the master 1 is conducted in this vacuum-seal condition, the static-pressure floating pad 18 is again returned to the position over the master 1.

At this time, collision of the static-pressure floating pad 18 against the master 1 can be obviated by continuously supplying compressed gas for floating to the gas-permeable body 25 of the static-pressure floating pad 18.

When the exhaust from the first and second suction grooves 21 and 22 is restarted in the condition where the static-pressure floating pad 18 is returned to the position over the master 1, a negative pressure also is generated on the lower side of the vacuum-seal valve 30, and the forces on the upper and lower sides of the vacuum-seal valve 30 are balanced. In this condition, a compressed gas is supplied from the gas-supply means to the air-cylinder portion 31 on the left side, whereby the vacuum-seal valve 30 is smoothly moved to the right side to close the electron-beam passage 19, resulting in a condition where irradiation of the master 1 with the electron-beam can be performed.

The present invention is not limited to the details of the above described preferred embodiments. The scope of the invention is defined by the appended claims, and all changes and modification as fall within the equivalence of the scope of the claims are therefore to be embraced by the invention.

What is claimed is:

1. An electron-beam irradiation system comprising:
   an electron-beam column;
   a vacuum chamber incorporating said electron-beam column; and
   a static-pressure floating pad connected to said vacuum chamber;
   wherein an electron-beam passes through an electron-beam passage to impinge on a body to be irradiated in the condition where said static-pressure floating pad is contactlessly attracted to the body to be irradiated;
   the improvement comprising
   a vacuum-seal valve for opening and closing the electron-beam passage, said vacuum-seal valve being provided inside said static-pressure floating pad.

2. An electron-beam irradiation system as set forth in claim 1, wherein said vacuum-seal valve is moved in a piston manner by the supply of a compressed gas.

3. An electron-beam irradiation system as set forth in claim 1, wherein said vacuum-seal valve is moved inside of said static-pressure floating pad with a minute gap therebetween.

4. An electron-beam irradiation system as set forth in claim 3, wherein said vacuum-seal valve is pressed against an O-ring to hermetically seal said electron-beam passage in the condition where said electron-beam passage is closed by said vacuum-seal valve.

5. An electron-beam irradiation system as set forth in claim 1, wherein said vacuum-seal valve is formed of a ceramic.

6. An electron-beam irradiation system as set forth in claim 1, wherein said body to be irradiated is a master of optical disks.

7. An electron-beam irradiation method using an electron-beam irradiation system including
   an electron-beam column,
   a vacuum chamber incorporating the electron-beam column, and
   a static-pressure floating pad connected to the vacuum chamber,
   wherein an electron-beam passes through an electron-beam passage to impinge on a body to be irradiated in the condition where the static-pressure floating pad is contactlessly attracted to the body to be irradiated,
   the improvement comprising the step of
   moving a vacuum-seal valve to close the electron-beam passage, said vacuum-seal valve being movably disposed inside the static-pressure floating pad, and thereby the inside of the vacuum chamber is maintained at a desired degree of vacuum.

8. An electron-beam irradiation method as set forth in claim 7, wherein said body to be irradiated is a master of optical disks.

* * * * *